(12) United States Patent
Moors et al.

(10) Patent No.: US 11,616,159 B2
(45) Date of Patent: *Mar. 28, 2023

(54) CONTACTS FOR SOLAR CELLS

(71) Applicants: SunPower Corporation, San Jose, CA (US); TOTAL MARKETING SERVICES, Puteaux (FR)

(72) Inventors: Matthieu Moors, Palo Alto, CA (US); David D. Smith, Campbell, CA (US); Gabriel Harley, Mountain View, CA (US); Taeseok Kim, Pleasanton, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 85 days.

This patent is subject to a terminal disclaimer.

(21) Appl. No.: 17/133,357

(22) Filed: Dec. 23, 2020

(65) Prior Publication Data

US 2021/0119071 A1  Apr. 22, 2021

Related U.S. Application Data

(63) Continuation of application No. 16/408,268, filed on May 9, 2019, now Pat. No. 10,879,413, which is a
(Continued)

(51) Int. Cl.
*H01L 31/061* (2012.01)
*H01L 31/0216* (2014.01)
(Continued)

(52) U.S. Cl.
CPC ...... *H01L 31/061* (2013.01); *H01L 31/02167* (2013.01); *H01L 31/022425* (2013.01);
(Continued)

(58) Field of Classification Search
None
See application file for complete search history.

(56) References Cited

U.S. PATENT DOCUMENTS

| | | |
|---|---|---|
| 3,993,533 A | 11/1976 | Milnes et al. |
| 4,058,418 A | 11/1977 | Lindmayer |

(Continued)

FOREIGN PATENT DOCUMENTS

| | | |
|---|---|---|
| CN | 102132423 | 7/2011 |
| DE | 10020412 | 11/2001 |

(Continued)

OTHER PUBLICATIONS

Cotter, et al., "Novel Process for Simplified Buried Contact Solar Cells," Institute of Electrical and Electronics Engineers, Aug. 2000, pp. 303-306.
(Continued)

*Primary Examiner* — Jay C Chang
(74) *Attorney, Agent, or Firm* — Schwabe, Williamson & Wyatt, P.C.

(57) ABSTRACT

A method of fabricating a solar cell is disclosed. The method can include forming a dielectric region on a surface of a solar cell structure and forming a metal layer on the dielectric layer. The method can also include configuring a laser beam with a particular shape and directing the laser beam with the particular shape on the metal layer, where the particular shape allows a contact to be formed between the metal layer and the solar cell structure.

20 Claims, 4 Drawing Sheets

Related U.S. Application Data continuation of application No. 15/499,732, filed on Apr. 27, 2017, now Pat. No. 10,290,758, which is a continuation of application No. 14/137,970, filed on Dec. 20, 2013, now Pat. No. 9,653,638.

(51) Int. Cl.
  *H01L 31/0224* (2006.01)
  *H01L 31/068* (2012.01)
  *H01L 31/18* (2006.01)

(52) U.S. Cl.
  CPC ........ *H01L 31/068* (2013.01); *H01L 31/1864* (2013.01); *Y02E 10/547* (2013.01)

(56) References Cited

U.S. PATENT DOCUMENTS

| | | |
|---|---|---|
| 4,318,938 A | 3/1982 | Barnett et al. |
| 4,393,576 A | 7/1983 | Dahlberg |
| 4,400,577 A | 8/1983 | Spear |
| 4,433,200 A | 2/1984 | Jester et al. |
| 4,461,922 A | 7/1984 | Gay et al. |
| 4,482,780 A | 11/1984 | Mitchell |
| 4,581,103 A | 4/1986 | Levine et al. |
| 4,582,588 A | 4/1986 | Jensen et al. |
| 4,617,421 A | 10/1986 | Nath et al. |
| 4,691,076 A | 9/1987 | Levine et al. |
| 4,695,674 A | 9/1987 | Bar-on |
| 4,697,041 A | 9/1987 | Okaniwa et al. |
| 4,882,298 A | 11/1989 | Moeller et al. |
| 4,917,752 A | 4/1990 | Jensen et al. |
| 4,957,601 A | 9/1990 | Levine et al. |
| 5,091,319 A | 2/1992 | Hotchkiss et al. |
| 5,380,371 A | 1/1995 | Murakami |
| 5,951,786 A | 9/1999 | Gee et al. |
| 5,980,679 A | 11/1999 | Severin et al. |
| 6,159,832 A | 12/2000 | Mayer |
| 6,288,326 B1 | 9/2001 | Hayashi et al. |
| 6,448,155 B1 | 9/2002 | Iwasaki et al. |
| 6,635,307 B2 | 10/2003 | Huang et al. |
| 7,355,114 B2 | 4/2008 | Ojima et al. |
| 8,003,530 B2 | 8/2011 | Grohe et al. |
| 8,146,643 B2 | 4/2012 | Kasahara et al. |
| 8,399,281 B1 | 3/2013 | Patterson et al. |
| 8,766,090 B2 | 7/2014 | Sewell et al. |
| 8,809,192 B2 | 8/2014 | Bertram et al. |
| 9,040,409 B2 | 5/2015 | Kumar et al. |
| 10,879,413 B2 * | 12/2020 | Moors .................. H01L 31/061 |
| 2005/0253142 A1 | 11/2005 | Negami et al. |
| 2006/0166023 A1 | 7/2006 | Yoshikata et al. |
| 2006/0213548 A1 | 9/2006 | Bachrach et al. |
| 2008/0013231 A1 | 1/2008 | Bazzano et al. |
| 2008/0042153 A1 | 2/2008 | Beeson et al. |
| 2008/0128019 A1 | 6/2008 | Lopatin et al. |
| 2008/0216887 A1 | 9/2008 | Hacke et al. |
| 2008/0223429 A1 | 9/2008 | Everett et al. |
| 2008/0240656 A1 | 10/2008 | Rollin et al. |
| 2008/0295884 A1 | 12/2008 | Sharma et al. |
| 2009/0194162 A1 | 8/2009 | Sivaram et al. |
| 2009/0255574 A1 | 10/2009 | Yu et al. |
| 2010/0032013 A1 | 2/2010 | Krause et al. |
| 2010/0071754 A1 | 3/2010 | Chang et al. |
| 2010/0139761 A1 | 6/2010 | Yun et al. |
| 2010/0200058 A1 | 8/2010 | Funakoshi |
| 2010/0243041 A1 * | 9/2010 | Carlson ............... H01L 31/0747 |
| | | 257/E31.127 |
| 2011/0240616 A1 | 10/2011 | Osako et al. |
| 2011/0298156 A1 | 12/2011 | Hooper et al. |
| 2012/0006394 A1 | 1/2012 | Richter et al. |
| 2012/0055541 A1 | 3/2012 | Granek et al. |
| 2012/0097245 A1 | 4/2012 | Nishina |
| 2012/0103408 A1 | 5/2012 | Moslehi et al. |
| 2012/0138138 A1 | 6/2012 | Granek et al. |
| 2012/0192935 A1 | 8/2012 | Zuniga et al. |
| 2012/0240995 A1 | 9/2012 | Coakley et al. |
| 2012/0305063 A1 * | 12/2012 | Moslehi .......... H01L 31/022458 |
| | | 257/E31.124 |
| 2013/0104977 A1 | 5/2013 | Yasutake et al. |
| 2013/0160825 A1 | 6/2013 | Lantzer et al. |
| 2013/0183796 A1 | 7/2013 | Stewart et al. |
| 2013/0247972 A1 | 9/2013 | Mungekar et al. |
| 2013/0258740 A1 | 10/2013 | Zhang |
| 2013/0284241 A1 | 10/2013 | Georgi et al. |

FOREIGN PATENT DOCUMENTS

| | | |
|---|---|---|
| EP | 1634673 | 3/2006 |
| EP | 2472601 | 7/2012 |
| JP | 2003/246971 | 9/2003 |
| JP | 2009/130116 | 6/2009 |
| JP | 2011/054831 | 3/2011 |
| JP | 2012/501551 | 1/2012 |
| TW | 2010/27773 | 7/2010 |
| WO | WO-9108584 | 6/1991 |
| WO | WO 1999/040760 | 8/1999 |
| WO | WO-2010/025269 | 3/2010 |
| WO | WO-2010/135153 | 11/2010 |

OTHER PUBLICATIONS

International Search Report and Written Opinion from PCT/US2014/071674 dated Apr. 15, 2015, 13 pgs.
International Preliminary Report on Patentability from PCT/US2014/071674 dated Jun. 21, 2016, 9 pgs.
First Action Interview Office Action from U.S. Appl. No. 14/137,970 dated Oct. 13, 2015, 6 pgs.
First Action Interview Pre-Interview Communication from U.S. Appl. No. 14/137,970 dated Jun. 22, 2015, 4 pgs.
Final Office Action from U.S. Appl. No. 14/137,970 dated Mar. 23, 2016, 16 pgs.
Non-Final Office Action from U.S. Appl. No. 14/137,970 dated Jul. 14, 2016, 20 pgs.
Non-Final Office Action from U.S. Appl. No. 15/499,732 dated Aug. 16, 2017, 6 pgs.
Non-Final Office Action from U.S. Appl. No. 15/499,732 dated Oct. 31, 2017, 8 pgs.
Final Office Action from U.S. Appl. No. 15/499,732 dated Mar. 22, 2018, 27 pgs.
Non-final Office Action from U.S. Appl. No. 16/408,268 dated Sep. 6, 2019, 19 pgs.
Non-final Notice of Reasons for Rejection from Japanese Patent Application No. 2018-182848 dated Oct. 16, 2019, 7 pgs.
Final Office Action from U.S. Appl. No. 16/408,268 dated Jan. 30, 2020, 15 pgs.

* cited by examiner

CONTACTS FOR SOLAR CELLS

CROSS-REFERENCE TO RELATED APPLICATIONS

This application is a continuation of U.S. patent application Ser. No. 16/408,268 filed on May 9, 2019, which is a continuation of U.S. patent application Ser. No. 15/499,732, filed on Apr. 27, 2017, now U.S. Pat. No. 10,290,758, issued on May 14, 2019, which is a continuation of U.S. patent application Ser. No. 14/137,970, filed on Dec. 20, 2013, now U.S. Pat. No. 9,653,638, issued on May 16, 2017, the entire contents of which are hereby incorporated by reference herein.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load. The external electrical circuit may receive electrical current from the solar cell by way of metal fingers that are connected to doped regions of the solar cell.

BRIEF SUMMARY

In an embodiment, a method of fabricating a solar cell is disclosed. The method includes forming a dielectric region on a surface of a solar cell structure and forming a metal layer on the dielectric layer. The method also includes configuring a laser beam with a particular shape and directing the laser beam with the particular shape on the metal layer, where the particular shape allows a contact to be formed between the metal layer and the solar cell structure. In an embodiment, the laser beam can be a spatially shaped laser beam or a temporally shaped laser beam. In an embodiment, the solar cell has a front side configured to face the sun during normal operation and a back side opposite the front side. In an embodiment, the laser beam can be directed onto the solar cell from the front side or from the back side.

In an embodiment, a solar cell fabricated using the above method is disclosed.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
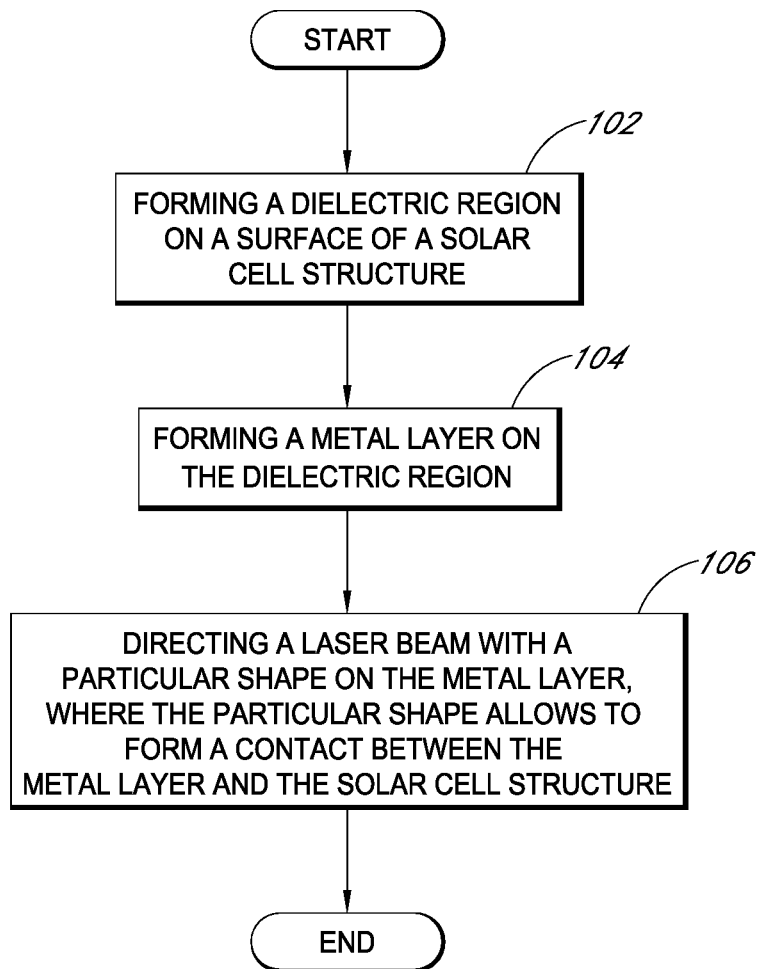
FIG. 1 is a flow chart representation of an example method for fabricating of a solar cell, according to some embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells for ease of understanding, the disclosed techniques and structures apply equally to other semiconductor structures (e.g., silicon wafers generally).

The formation of metal regions, such as positive and negative busbars and contact fingers to doped regions on a solar cell can be a challenging process. Techniques and structures disclosed herein improve precision throughput and cost for related fabrication processes.

In the present disclosure, numerous specific details are provided, such as examples of structures and methods, to provide a thorough understanding of embodiments. Persons of ordinary skill in the art will recognize, however, that the embodiments can be practiced without one or more of the specific details. In other instances, well-known details are not shown or described to avoid obscuring aspects of the embodiments.

FIG. 1 illustrates a flow chart of an embodiment for an example fabrication method for a solar cell. In various embodiments, the method of FIG. 1 can include additional (or fewer) blocks than illustrated. The method of FIG. 1 can be performed at the cell level during fabrication of the solar cell or at the module level when the solar cell is connected and packaged with other solar cells. The example method of FIG. 1 is first described followed by examples illustrating the stages of the method at FIGS. 2-4.

As shown in 102, a dielectric region, which can also be referred to as a dielectric layer or a passivation layer, can be formed on a surface of a solar cell structure. In an embodiment, the dielectric region can be formed over an N-type doped region and a P-type doped region of the solar cell structure. In one embodiment, the dielectric region is a continuous and conformal layer that is formed by blanket deposition. In an embodiment, the dielectric region can be formed by screen printing, spin coating, or by deposition (Chemical Vapor Deposition CVD, plasma-enhanced chemical vapor deposition (PECVD) or Physical Vapor Deposition PVD) and patterning, for example. In various embodiments, the dielectric region can include silicon nitride, silicon oxide, silicon oxynitride, aluminum oxide, amorphous silicon or polysilicon.

In one embodiment, the dielectric region can be partially removed (e.g., patterned) forming a contact region. In an embodiment, a laser beam can be directed on the dielectric region to partially remove the dielectric region. Note that in other embodiments, the dielectric region can be formed in a pattern and not need to be patterned after being formed. In an embodiment, the dielectric region need not be partially removed.

In an embodiment, the contact region can allow for the formation of a contact, such as an ohmic contact. In some embodiments, the dielectric region can be maintained between the ohmic contact and the silicon substrate (e.g., no dissociation of the dielectric region) whereas in other embodiments, the contact can be in direct contact with the silicon substrate, where the dielectric region dissociates. In an embodiment, the dielectric region is partially removed at a particular location, with the particular location being aligned over a N-type doped region or a P-type doped region of the solar cell structure. At 104, a metal layer can be formed on the dielectric region. In one embodiment, the metal layer is a continuous and conformal layer that is formed by blanket deposition. In an embodiment, forming a metal layer can include performing a physical vapor deposition, screen printing, sintering, plating or laser transfer process. In an embodiment, the metal layer can also be referred to as a seed metal layer. In an embodiment, forming the metal layer can include depositing a seed metal layer on the dielectric region. In an embodiment, the metal layer can include a metal foil. In an embodiment, the metal layer can be of at least of a particular thickness to conduct current. In an embodiment, the metal layer can have a thickness in the range of 1-5 microns, for example the metal layer can be in the range of approximately 1-2 microns (e.g. a seed metal layer). In an embodiment, the metal layer can have a thickness in the range of 1-100 microns (e.g. a metal foil), for example the metal layer can be approximately 50 microns. In an embodiment, the metal layer can include a metal such as, but not limited to, copper, tin, aluminum, silver, gold, chromium, iron, nickel, zinc, ruthenium, palladium, or platinum and their alloys. In an embodiment, the metal layer can be a patterned metal layer. In an embodiment the patterned metal layer can be placed, deposited or aligned on the dielectric region. In an embodiment, portions of the metal layer can be partially removed to form an interdigitated pattern.

An example illustration of the fabrication process described at blocks 102 and 104 is shown as a cross-section of a solar cell at FIG. 2, as described below.

At 106, a contact can be formed on a solar cell structure. In an embodiment, forming a contact can include configuring a laser beam with a particular shape and directing a laser beam on a metal layer. In an embodiment, directing a laser beam can include directing a locally confined energetic beam on the metal layer. In an embodiment, the laser beam can be spatially or temporally shaped, which can reduce potential damage to the solar cell. In an embodiment, the laser used can be a low power (e.g., less than 50 milli-Watts) multi-pulse laser. In an embodiment, the laser beam can be generated using a continuous wave (CW) laser or a pulsed laser.

In an embodiment, forming a contact can include forming an ohmic contact. In an embodiment, the laser beam can be directed on a metal foil, or other metal layer, to form the ohmic contact on the solar cell structure. In various embodiments, the laser can be directed from different locations relative to the solar cell (e.g., from the front side, from the back side, etc.), as described herein.

Various examples of block 106 (e.g., front-side laser contact formation, back-side laser contact formation, etc.) are illustrated in cross-sections of a solar cell being fabricated at FIGS. 3-4, as described below.

In some embodiments, the method of FIG. 1 can be performed for multiple solar cells at a time. For example, in one embodiment, a metal foil (e.g., including contact fingers for multiple cells) can be aligned and placed on both a first solar cell and a second solar cell. The metal foil can then be coupled to both the first and second solar cell according to the method of FIG. 1.

FIGS. 2-4 and 7 are cross-sectional views that schematically illustrate the method of FIG. 1.

Figure 2:
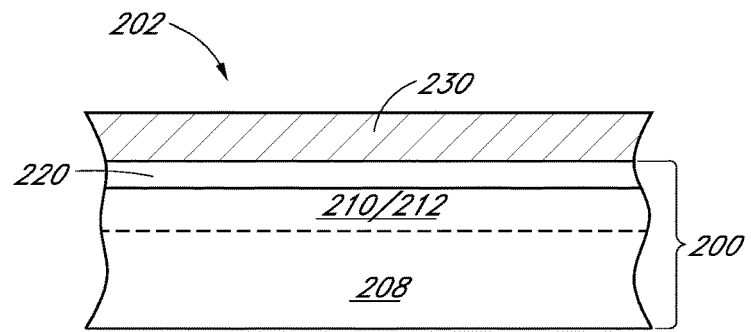
FIG. 2 is a cross-section of a metal layer on a solar cell structure.

With reference to FIG. 2, a solar cell during a fabrication process is shown that includes a metal layer 230 placed on a solar cell structure 200. As shown, the solar cell structure 200 can include a silicon substrate 208, a first doped region 210 or a second doped region 212 and a dielectric region 220. The solar cell of FIG. 2 can also include a front side 204, configured to face the sun during normal operation of the solar cell and a back side 202 opposite the front side. As discussed above, the metal layer can include a metal such as, but not limited to, copper, tin, aluminum, silver, gold, chromium, iron, nickel, zinc, ruthenium, palladium, or platinum, and their alloys. In an embodiment, the dielectric region can include silicon nitride, silicon oxide, silicon oxynitride, aluminum oxide, amorphous silicon or polysilicon. In an embodiment, the first doped region 210 or the second doped region 212 can include a P-type doped region or an N-type doped region of the silicon substrate 208. In an embodiment, the ohmic contact is aligned with a particular region of the solar cell structure 200, such as aligned to a P-type doped region or an N-type doped region.

Figure 3:
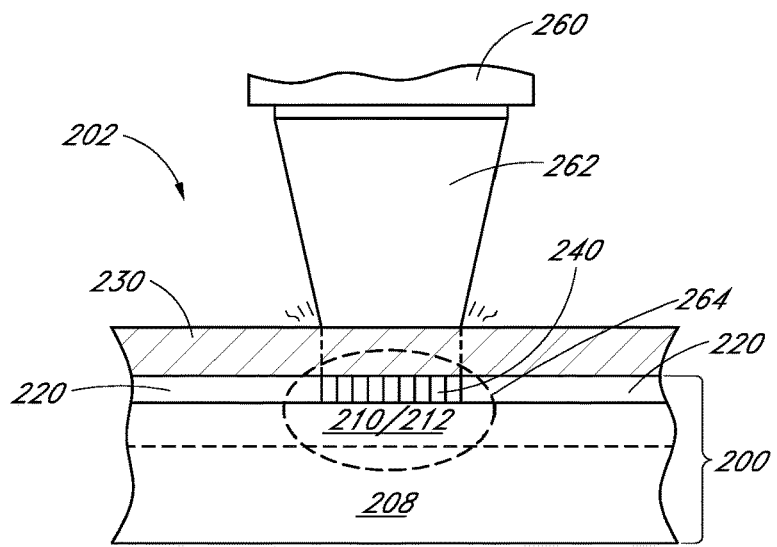
FIG. 3 is a cross-section of directing a laser beam on a metal layer from a back side of a solar cell, according to some embodiments.
Figure 4:
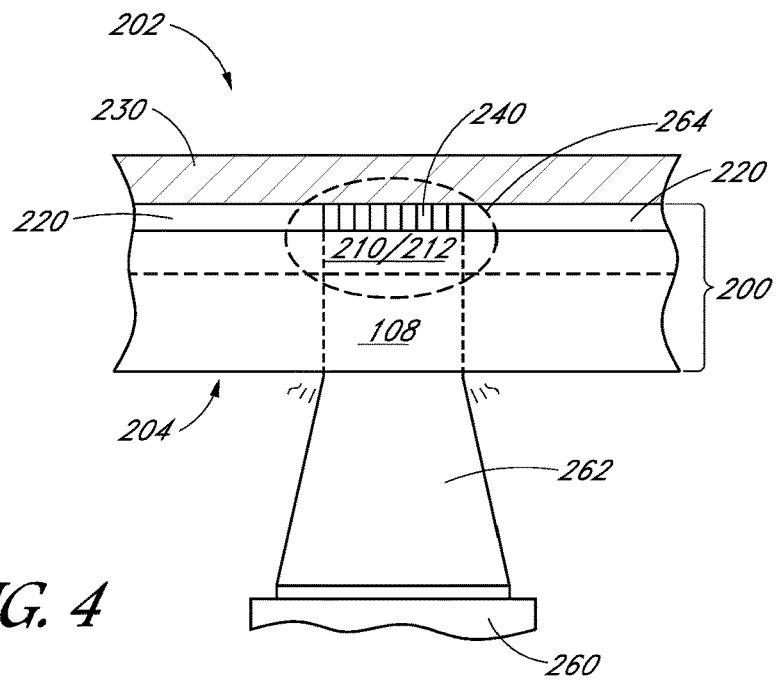
FIG. 4 is a cross-section of directing a laser beam on a metal layer from a front side of a solar cell, according to some embodiments.

FIGS. 3 and 4 illustrate directing a laser beam 262 from a laser source 260 with the particular shape on the metal layer 230 to form a contact 240. In an embodiment, the laser beam can be directed on the back side 202 of the solar cell as shown in FIG. 3. Provided the laser beam 262 is directed from the back side 202, a laser beam 262 having a spectrum such as ultraviolet, infrared and green can be used. In an embodiment, the laser beam 262 can be directed on the front side 204 of the solar cell as shown in FIG. 4. Provided the laser beam 262 is directed from the front side 204, the laser beam 262 can have a wavelength greater than 10 microns. In an embodiment, the laser beam 262 can be directed from the front side 204 of the solar cell, where the laser beam 262 can be transmitted through solar cell structure 200 heating the metal layer 230 to form the contact 240. In an embodiment, the contact 240 can be formed by a laser welding, laser ablation or laser heating process. In an embodiment, the contact 240 can be formed by configuring the laser beam 262 to have either a spatial or temporal profile, where the spatial or temporal profile can allow for heating of the metal layer 240 and dielectric region 220. In an embodiment, the contact 240 can be formed by configuring the laser beam 262 to form the contact 240 without excessively damaging the irradiated region directed for contact formation region 264. In an embodiment, heating the dielectric region 220 with a spatial or temporal profile can dissociate the dielectrics, such as melting amorphous silicon (a-Si) to form a contact 240. In an embodiment, the contact 240 can be an ohmic contact. In an embodiment, the ohmic contact can be formed between the metal layer 230 and the silicon substrate 208. In an embodiment, the contact 240 can mechanically couple the metal layer 230 to the solar cell structure 200.

Figure 5:
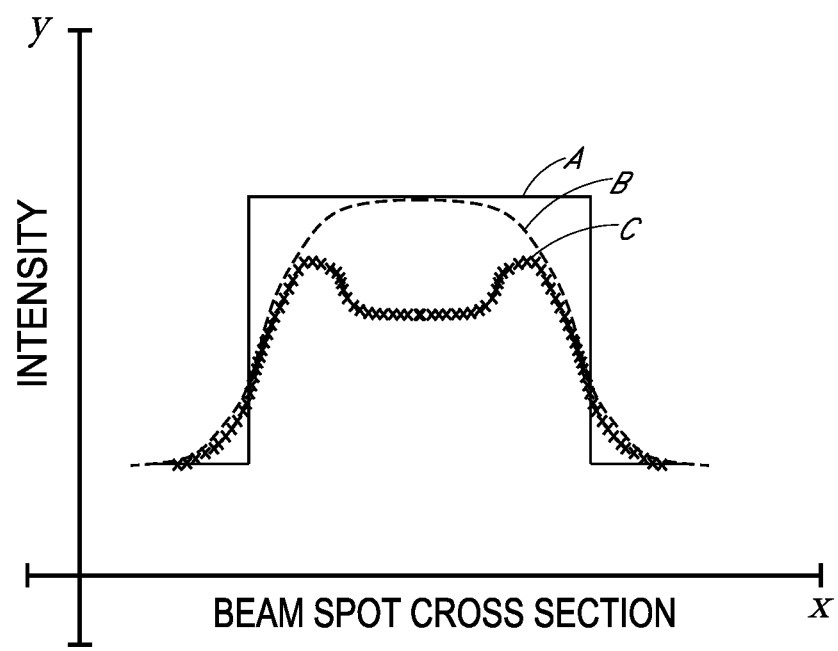
FIG. 5 is a graphical representation of a spatial profile, according to some embodiments.
Figure 6:
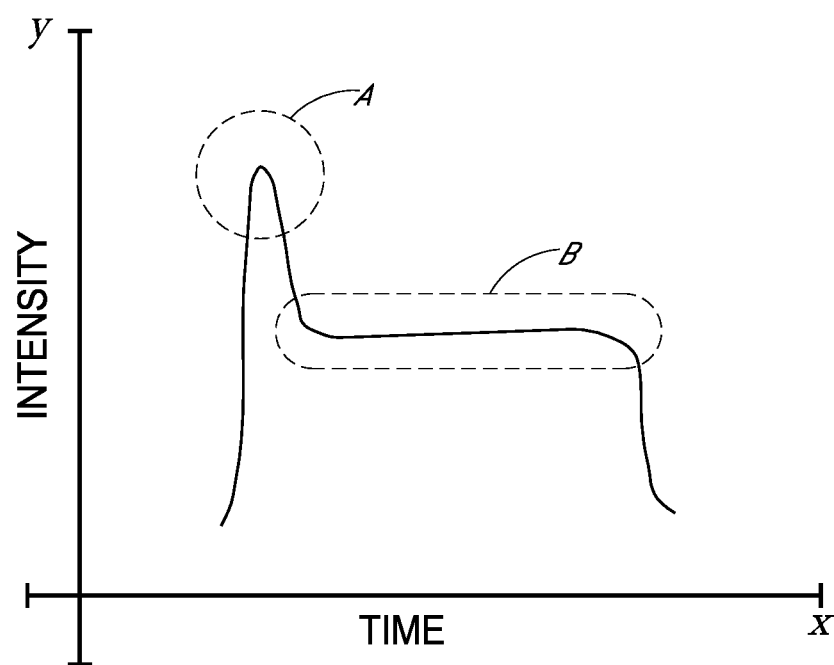
FIG. 6 is a graphical representation of a temporal profile, according to the disclosed techniques.

With reference to FIGS. 5 and 6, example laser beam intensity profiles are shown. Example spatial profiles can include a top-hat spatial profile (shown as "A" in FIG. 5), a Gaussian spatial profile (shown as "B" in FIG. 5) and a donut shaped spatial profile (shown as "C" in FIG. 5), although other spatial profiles can be used. In an embodiment, the laser beam can be spatially shaped, such as shown in FIG. 5, where the spatial beam spot profile is configured to form an ohmic contact without excessively damaging the center of the contact formation region 264 from FIGS. 3 and 4.

Referring to FIG. 6, an example temporal profile is shown. In FIG. 6, the temporal profile shows a first high intensity pulse (shown as "A" in FIG. 6) for dissociating the dielectric region 220 underneath the metal layer 230 and subsequently the followed by a continuous low intensity pulse (shown as "B" in FIG. 6) to form the contact 240 (e.g., a non-abrasive ohmic contact).

Figure 7:
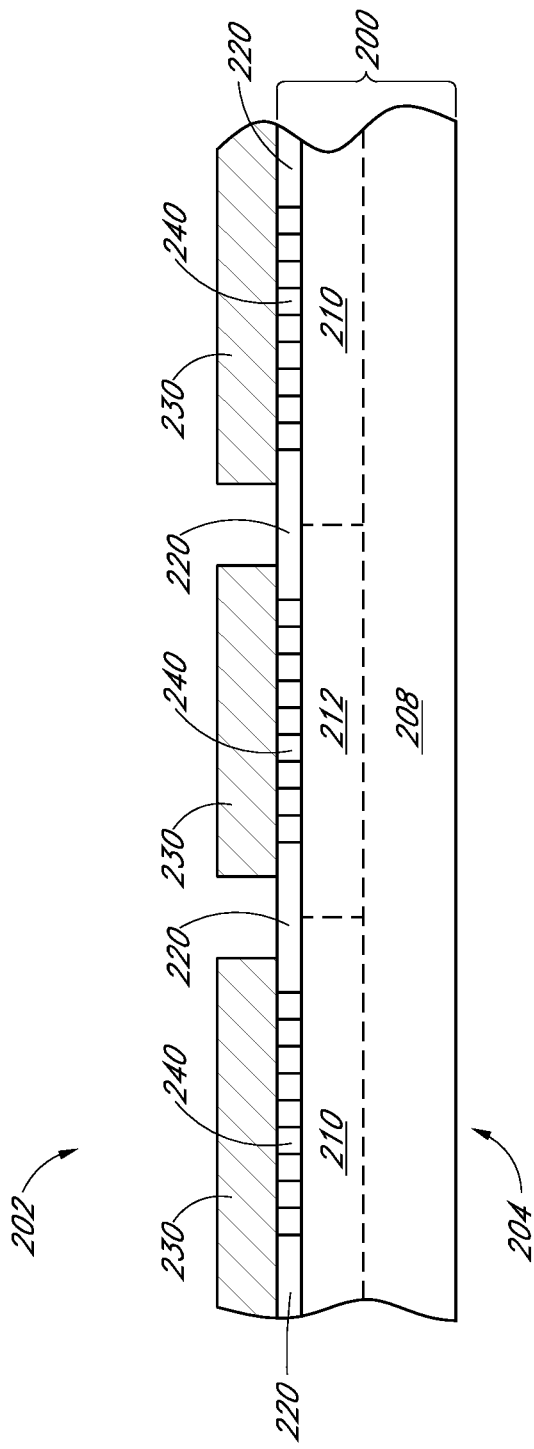
FIG. 7 is a cross-section of an example solar cell fabricated according to the disclosed techniques.

FIG. 7 illustrates a solar cell subsequent to the process performed in FIGS. 2-6. The solar cell of FIG. 7 can include a front side 204, configured to face the sun during normal operation of the solar cell and a back side 202 opposite the front side. As shown, the solar cell can include a solar cell structure 200. The solar cell 200 structure can include a silicon substrate 208, first and second doped regions 210, 212 and a dielectric region 220. The solar cell structure 200 is coupled to the metal layer 230 by a contact 240, such as an ohmic contact. Contact fingers, made up of the first and second metal layers 230, 232 can be separated. It is to be noted that electrical connection at the separation can allow for an electrical short and can be detrimental to the performance of the solar cell. The gap or separation, as shown in FIG. 7, can be formed by a laser ablation process, removing excess metal from the metal layer 230. In an embodiment, the first and second doped region can be P-type and N-type doped regions. In an embodiment, the dielectric region 220 can be patterned such that some areas do not have dielectric regions under the metal layer 230. In an embodiment, the metal layer 230 can be a metal foil. In an embodiment, the metal foil can be composed of aluminum. In an embodiment, the metal layer 230 can be a patterned metal foil. In an embodiment, the patterned metal foil can be placed on the solar cell structure 200. In an embodiment, portions of the metal layer 230 can be removed in an interdigitated pattern prior to directing the laser beam. In an embodiment, the metal layer 230 can have a thickness in the range of 1-5 microns, for example the metal layer 230 can be in the range of approximately 1-2 microns (e.g. a seed metal layer). In an embodiment, the metal layer 232 can have a thickness in the range of 1-100 microns (e.g. a metal foil), for example the metal layer 232 can be approximately 50 microns.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar cell, comprising:
   a doped region on the solar cell, wherein the doped region is located at a back surface of the solar cell;
   a dielectric layer directly on the doped region, the dielectric layer having a dissociated region therein, wherein the dissociated region is in contact with the doped region, wherein the dissociated region comprises dissociated material of the dielectric layer; and
   a metal layer directly on the dielectric layer, the metal layer in contact with the dissociated material of the dissociated region of the dielectric layer, and wherein the dissociated material of the dissociated region of the dielectric layer is vertically between and physically contacts both the metal layer and the doped region.

2. The solar cell of claim 1, wherein the doped region is an N-type doped region or a P-type doped region.

3. The solar cell of claim 1, wherein the dissociated region provides an ohmic contact between the metal layer and the doped region.

4. The solar cell of claim 1, wherein the dissociated region mechanically couples the metal layer and the doped region.

5. The solar cell of claim 1, the metal layer comprises a metal foil.

6. The solar cell of claim 1, wherein the dissociated region is a melted amorphous silicon region.

7. The solar cell of claim 1, wherein the metal layer comprises a metal selected from a group consisting of copper, tin, aluminum, silver, gold, chromium, iron, nickel, zinc, ruthenium, palladium and platinum.

8. The solar cell of claim 1, wherein the dielectric layer comprises a material selected from a group consisting of silicon nitride, silicon oxide, silicon oxynitride, aluminum oxide, amorphous silicon and polysilicon.

9. A solar cell, comprising:
a doped region on the solar cell, wherein the doped region is located at a back surface of the solar cell;
a dielectric layer directly on the doped region, the dielectric layer having a partially removed region therein, wherein the partially removed region is in contact with the doped region, wherein the partially removed region comprises material of the dielectric layer; and
a metal layer directly on the dielectric layer, the metal layer is in contact with the material of the dielectric layer of the partially removed region of the dielectric layer, and wherein the material of the dielectric layer of the partially removed region of the dielectric layer is vertically between and physically contacts both the metal layer and the doped region.

10. The solar cell of claim 9, wherein the doped region is an N-type doped region or a P-type doped region.

11. The solar cell of claim 9, wherein the partially removed region provides an ohmic contact between the metal layer and the doped region.

12. The solar cell of claim 9, wherein the partially removed region mechanically couples the metal layer and the doped region.

13. The solar cell of claim 9, wherein the metal layer comprises a metal foil.

14. The solar cell of claim 9, wherein the metal layer comprises a metal selected from a group consisting of copper, tin, aluminum, silver, gold, chromium, iron, nickel, zinc, ruthenium, palladium and platinum.

15. The solar cell of claim 9, wherein the dielectric layer comprises a material selected from a group consisting of silicon nitride, silicon oxide, silicon oxynitride, aluminum oxide, amorphous silicon and polysilicon.

16. A solar cell, comprising:
a silicon substrate having a back surface opposite a light-receiving surface;
a N-type doped region and a P-type doped region on the silicon substrate, wherein the N-type doped region and the P-type doped region are located at the back surface of the silicon substrate;
a dielectric layer directly on the N-type doped region and the P-type doped region, the dielectric layer having a dissociated region therein, wherein the dissociated region is in contact with the N-type doped region and the P-type doped region, wherein the dissociated region comprises dissociated material of the dielectric layer; and
a metal layer directly on the dielectric layer, the metal layer is in contact with the dissociated material of the dissociated region of the dielectric layer, and wherein the dissociated material of the dissociated region of the dielectric layer is vertically between and physically contacts both the metal layer and one of the P-type doped region or the N-type doped region.

17. The solar cell of claim 16, wherein the dissociated region provides an ohmic contact between the metal layer and one of the N-type doped region or P-type doped region.

18. The solar cell of claim 16, wherein the dielectric layer comprises a material selected from a group consisting of silicon nitride, silicon oxide, silicon oxynitride, aluminum oxide, amorphous silicon and polysilicon.

19. The solar cell of claim 16, wherein the metal layer comprises a metal foil.

20. The solar cell of claim 16, wherein the metal layer comprises a metal selected from a group consisting of copper, tin, aluminum, silver, gold, chromium, iron, nickel, zinc, ruthenium, palladium and platinum.

* * * * *